United States Patent
Hsu et al.

(10) Patent No.: US 7,455,793 B2
(45) Date of Patent: *Nov. 25, 2008

(54) NON-AQUEOUS DISPERSIONS COMPRISING ELECTRICALLY DOPED CONDUCTIVE POLYMERS AND COLLOID-FORMING POLYMERIC ACIDS

(75) Inventors: Che-Hsiung Hsu, Wilmington, DE (US); Ralph Birchard Lloyd, Fayetteville, NC (US)

(73) Assignee: E.I. du Pont de Nemours and Company, Wilmington, DE (US)

( * ) Notice: Subject to any disclaimer, the term of this patent is extended or adjusted under 35 U.S.C. 154(b) by 440 days.

This patent is subject to a terminal disclaimer.

(21) Appl. No.: 10/815,054

(22) Filed: Mar. 31, 2004

(65) Prior Publication Data
US 2005/0224765 A1  Oct. 13, 2005

(51) Int. Cl.
C08G 61/00 (2006.01)
(52) U.S. Cl. ............ 252/500; 252/511; 528/373
(58) Field of Classification Search ............. 252/500, 252/511; 528/373
See application file for complete search history.

(56) References Cited

U.S. PATENT DOCUMENTS

| 5,300,575 A | | 4/1994 | Jonas et al. | |
|---|---|---|---|---|
| 5,578,249 A | | 11/1996 | Ohtani et al. | |
| 5,624,605 A | * | 4/1997 | Cao et al. | 252/500 |
| 5,968,416 A | * | 10/1999 | Smith et al. | 252/500 |
| 6,228,492 B1 | * | 5/2001 | Kinlen et al. | 428/373 |
| 7,108,805 B2 | * | 9/2006 | Tahon et al. | 252/500 |
| 2002/0031602 A1 | * | 3/2002 | Zhang | 427/58 |
| 2002/0036291 A1 | * | 3/2002 | Parker et al. | 257/72 |
| 2002/0038999 A1 | * | 4/2002 | Cao et al. | 313/503 |
| 2003/0025106 A1 | * | 2/2003 | Schwark et al. | 252/500 |
| 2004/0102577 A1 | * | 5/2004 | Hsu et al. | 525/182 |
| 2004/0127637 A1 | * | 7/2004 | Hsu et al. | 524/800 |
| 2004/0254297 A1 | * | 12/2004 | Hsu et al. | 525/54.2 |
| 2005/0205860 A1 | * | 9/2005 | Hsu et al. | 257/40 |
| 2005/0208328 A1 | * | 9/2005 | Hsu et al. | 428/690 |
| 2005/0209388 A1 | * | 9/2005 | Hsu et al. | 524/457 |

FOREIGN PATENT DOCUMENTS

EP  1 564 251  8/2005
WO  WO 02/065484 A1  8/2002

(Continued)

OTHER PUBLICATIONS

C. Barthet and M. Guglielmi, "Mixed electronic and ionic conductors: a new route to Nafion-doped polyaniline" in Journal of Electroanalytical Chemistry, vol. 388, pp. 45-44, 1995, XP002344587, ISSN: 0022-0728, Elsevier Science S.A., Amsterdam, NL, May 1995.

(Continued)

Primary Examiner—Gregory E Webb
(74) Attorney, Agent, or Firm—John H. Lamming

(57) ABSTRACT

Compositions, and methods of making, are provided comprising non-aqueous dispersions of at least one doped conductive polymer and at least one colloid-forming polymeric acid, wherein the conductive polymer is selected from a polythiophene, a polypyrrole, a polyaniline, and combinations thereof. Electronic devices and other applications having at least one layer made from at least one such compositions are further provided.

21 Claims, 1 Drawing Sheet

FOREIGN PATENT DOCUMENTS

WO     WO 2005/090436 A     9/2005

OTHER PUBLICATIONS

J.Y. Kim et al., "Enhancement of electrical conductivity of poly(3,4-ethylenedioxythiophene)/poly (4-styrenesulfonate) by a change of solvents" in Synthetic Metals, vol. 126, No. 2/3, pp. 311-316, Feb. 2002, XP001189321, ISSN: 0379-6779, Elsevier Science B.V., Lausanne, CH.

Hsu C. -H., Novel Preparation and Properties of Conductive Polyaniline/Nafion(R) Film, Synthetic Metals, 1991, 671-674, 41-43, Elsevier Sequoia, The Netherlands, Apr. 1991.

* cited by examiner

NON-AQUEOUS DISPERSIONS COMPRISING ELECTRICALLY DOPED CONDUCTIVE POLYMERS AND COLLOID-FORMING POLYMERIC ACIDS

FIELD OF THE INVENTION

The invention relates to non-aqueous dispersions of electrically doped conducting polymers and colloid-forming polymeric acids.

BACKGROUND OF THE INVENTION

Electrically conducting polymers have been used in a variety of organic electronic devices, including in the development of electroluminescent ("EL") devices for use in light emissive displays. With respect to EL devices, such as organic light emitting diodes (OLEDs) containing conducting polymers, such devices generally have the following configuration:

anode/buffer layer/EL material/cathode

The anode is typically any material that is transparent and has the ability to inject holes into the EL material, such as, for example, indium/tin oxide (ITO). The anode is optionally supported on a glass or plastic substrate. EL materials include fluorescent dyes, fluorescent and phosphorescent metal complexes, conjugated polymers, and mixtures thereof. The cathode is typically any material (such as, e.g., Ca or Ba) that has the ability to inject electrons into the EL material.

The buffer layer is typically an electrically conducting polymer and facilitates the injection of holes from the anode into the EL material layer. The buffer layer can also be called a hole-injection layer, a hole transport layer, or may be characterized as part of a bilayer anode. Typical conducting polymers employed as buffer layers include polyaniline ("PAni") and polydioxythiophenes such as poly(3,4-ethylenedioxythiophene) ("PEDT"). These materials can be prepared by polymerizing aniline or dioxythiophene monomers in aqueous solution in the presence of a water soluble polymeric acid, such as poly(styrenesulfonic acid) (PSSA), or poly(2-acrylamido-2-methyl-1-propanesulfonic acid) ("PAAMPSA"), as described in, for example, U.S. Pat. No. 5,300,575 and published PCT application WO 02/065484. A well known PEDT/PSS material is Baytron®-P, commercially available from H. C. Starck, GmbH (Leverkusen, Germany).

There is a need for improved conductive polymers with good processability and increased conductivity.

SUMMARY OF THE INVENTION

New compositions are provided comprising non-aqueous dispersions of at least one doped conductive polymer and at least one colloid-forming polymeric acid, wherein the doped conductive polymer is selected from a polythiophene, a polypyrrole, a polyaniline, and combinations thereof.

Also provided are methods for preparing the new compositions.

In another embodiment, electronic devices and other applicatipons comprising at least one layer made from the new composition are provided.

The foregoing general description and the following detailed description are exemplary and explanatory only and are not restrictive of the invention, as defined in the appended claims.

BRIEF DESCRIPTION OF THE FIGURES

The invention is illustrated by way of example and not limited in the accompanying figures.

DETAILED DESCRIPTION OF THE INVENTION

Figure 1:
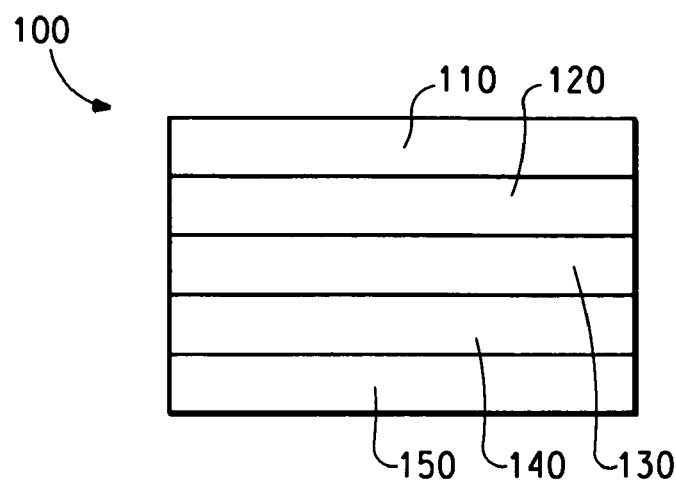
FIG. 1 illustrates a cross-sectional view of an electronic device that comprises a buffer layer comprising the new composition.

In one embodiment, compositions are provided comprising non-aqueous dispersions of at least one conductive polymer and at least one colloid-forming polymeric acid, wherein the conductive polymer is selected from a polythiophene, a polypyrrole, a polyaniline, and combinations thereof.

As used herein, the term "dispersion" refers to a continuous liquid medium containing a suspension of minute particles. The "continuous medium" comprises a non-aqueous liquid. As used herein, the term "non-aqueous" refers to a liquid medium that has a significant portion of an organic liquid, and in one embodiment it is at least about 60% by weight organic liquid. The organic liquid may include one or more organic compounds. As used herein, the term "colloid" refers to the minute particles suspended in the continuous medium, said particles having a nanometer-scale particle size. As used herein, the term "colloid-forming" refers to substances that form minute particles when dispersed in the non-aqueous liquid, i.e., "colloid-forming" polymeric acids are not soluble in the particular liquid medium used.

The conductive polymers suitable for the new composition can be homopolymers, or they can be co-polymers of two or more respective monomers. The composition may further comprise one or more different conductive polymers and one or more different colloid-forming polymeric acids.

Polythiophenes contemplated for use in the new composition comprise Formula I below:

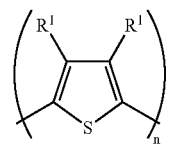

(I)

wherein:

R$^1$ is independently selected so as to be the same or different at each occurrence and is selected from hydrogen, alkyl, alkenyl, alkoxy, alkanoyl, alkythio, aryloxy, alkylthioalkyl, alkylaryl, arylalkyl, amino, alkylamino, dialkylamino, aryl, alkylsulfinyl, alkoxyalkyl, alkylsulfonyl, arylthio, arylsulfinyl, alkoxycarbonyl, arylsulfonyl, acrylic acid, phosphoric acid, phosphonic acid, halogen, nitro, cyano, hydroxyl, epoxy, silane, siloxane, alcohol, benzyl, carboxylate, ether, amidosulfonate, ether carboxylate, ether sulfonate, and urethane; or both R$^1$ groups together may form an alkylene or alkenylene chain completing a 3, 4, 5, 6, or 7-membered aromatic or alicyclic ring, which ring may optionally include one or more divalent nitrogen, sulfur or oxygen atoms, and n is at least about 4.

As used herein, the term "alkyl" refers to a group derived from an aliphatic hydrocarbon and includes linear, branched and cyclic groups which may be unsubstituted or substituted. The term "heteroalkyl" is intended to mean an alkyl group, wherein one or more of the carbon atoms within the alkyl group has been replaced by another atom, such as nitrogen, oxygen, sulfur, and the like. The term "alkylene" refers to an alkyl group having two points of attachment.

As used herein, the term "alkenyl" refers to a group derived from an aliphatic hydrocarbon having at least one carbon-carbon double bond, and includes linear, branched and cyclic groups which may be unsubstituted or substituted. The term "heteroalkenyl" is intended to mean an alkenyl group, wherein one or more of the carbon atoms within the alkenyl group has been replaced by another atom, such as nitrogen, oxygen, sulfur, and the like. The term "alkenylene" refers to an alkenyl group having two points of attachment.

As used herein, the following terms for substituent groups refer to the formulae given below:

| | |
|---|---|
| "alcohol" | —$R^3$—OH |
| "amidosulfonate" | —$R^3$—C(O)N($R^6$) $R^4$—$SO_3$Z |
| "benzyl" | —$CH_2$—$C_6H_5$ |
| "carboxylate" | —$R^3$—C(O)O—Z |
| "ether" | —$R^3$—O—$R^5$ |
| "ether carboxylate" | —$R^3$—O—$R^4$—C(O)O—Z |
| "ether sulfonate" | —$R^3$—O—$R^4$—$SO_3$Z |
| "urethane" | —$R^3$—O—C(O)—N($R^6$)$_2$ | where all "R" groups are the same or different at each occurrence and:

$R^3$ is a single bond or an alkylene group
$R^4$ is an alkylene group
$R^5$ is an alkyl group
$R^6$ is hydrogen or an alkyl group
Z is H, alkali metal, alkaline earth metal, N($R^5$)$_4$ or $R^5$
Any of the above groups may further be unsubstituted or substituted, and any group may have fluorine substituted for one or more hydrogens, including perfluorinated groups.

In one embodiment, in the polythiophene both $R^1$ together form —O—(CHY)$_m$—O—, where m is 2 or 3, and Y is the same or different at each occurrence and is selected from hydrogen, alkyl, alcohol, amidosulfonate, benzyl, carboxylate, ether, ether carboxylate, amidosulfonate, ether sulfonate, and urethane. In one embodiment, all Y are hydrogen. In one embodiment, the polythiophene is poly(3,4-ethylenedioxythiophene). In one embodiment, at least one Y group is not hydrogen. In one embodiment, at least one Y group is a substituent having fluorine substituted for at least one hydrogen. In one embodiment, at least one Y group is perfluorinated.

Polypyrroles contemplated for use the new composition comprise Formula II below.

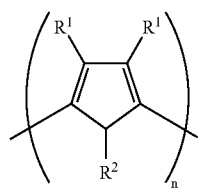

(II)

where in Formula II:
n is at least about 4;

$R^1$ is independently selected so as to be the same or different at each occurrence and is selected from hydrogen, alkyl, alkenyl, alkoxy, alkanoyl, alkythio, aryloxy, alkylthioalkyl, alkylaryl, arylalkyl, amino, alkylamino, dialkylamino, aryl, alkylsulfinyl, alkoxyalkyl, alkylsulfonyl, arylthio, arylsulfinyl, alkoxycarbonyl, arylsulfonyl, acrylic acid, phosphoric acid, phosphonic acid, halogen, nitro, cyano, hydroxyl, epoxy, silane, siloxane, alcohol, benzyl, carboxylate, ether, ether carboxylate, amidosulfonate, ether sulfonate, and urethane; or both $R^1$ groups together may form an alkylene or alkenylene chain completing a 3, 4, 5, 6, or 7-membered aromatic or alicyclic ring, which ring may optionally include one or more divalent nitrogen, sulfur or oxygen atoms; and $R^2$ is independently selected so as to be the same or different at each occurrence and is selected from hydrogen, alkyl, alkenyl, aryl, alkanoyl, alkylthioalkyl, alkylaryl, arylalkyl, amino, epoxy, silane, siloxane, alcohol, benzyl, carboxylate, ether, amidosulfonate, ether carboxylate, ether sulfonate, and urethane.

In one embodiment, $R^1$ is the same or different at each occurrence and is independently selected from hydrogen, alkyl, alkenyl, alkoxy, cycloalkyl, cycloalkenyl, alcohol, benzyl, carboxylate, ether, amidosulfonate, ether carboxylate, ether sulfonate, urethane, epoxy, silane, siloxane, and alkyl substituted with one or more of sulfonic acid, carboxylic acid, acrylic acid, phosphoric acid, phosphonic acid, halogen, nitro, cyano, hydroxyl, epoxy, silane, or siloxane moieties.

In one embodiment, $R^2$ is selected from hydrogen, alkyl, and alkyl substituted with one or more of sulfonic acid, carboxylic acid, acrylic acid, phosphoric acid, phosphonic acid, halogen, cyano, hydroxyl, epoxy, silane, or siloxane moieties.

In one embodiment, the polypyrrole is unsubstituted and both $R^1$ and $R^2$ are hydrogen.

In one embodiment, both $R^1$ together form a 6- or 7-membered alicyclic ring, which is further substituted with a group selected from alkyl, heteroalkyl, alcohol, benzyl, carboxylate, ether, ether carboxylate, amidosulfonate, ether sulfonate, and urethane. These groups can improve the solubility of the monomer and the resulting polymer. In one embodiment, both $R^1$ together form a 6- or 7-membered alicyclic ring, which is further substituted with an alkyl group. In one embodiment, both $R^1$ together form a 6- or 7-membered alicyclic ring, which is further substituted with an alkyl group having at least 1 carbon atom.

In one embodiment, both $R^1$ together form —O—(CHY)$_m$—O—, where m is 2 or 3, and Y is the same or different at each occurrence and is selected from hydrogen, alkyl, alcohol, benzyl, carboxylate, ether, ether carboxylate, amidosulfonate, ether sulfonate, and urethane. In one embodiment, at least one Y group is not hydrogen. In one embodiment, at least one Y group is a substituent having fluorine substituted for at least one hydrogen. In one embodiment, at least one Y group is perfluorinated.

Polyanilines contemplated for use in the new composition comprise Formula III or Formula IV below.

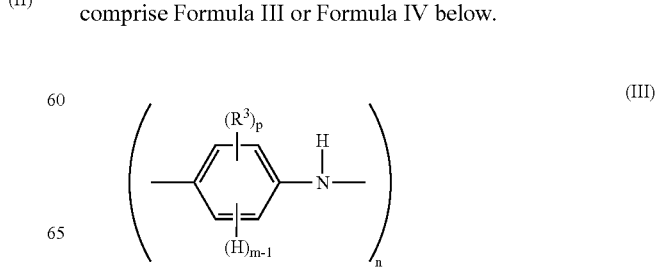

(III)

-continued

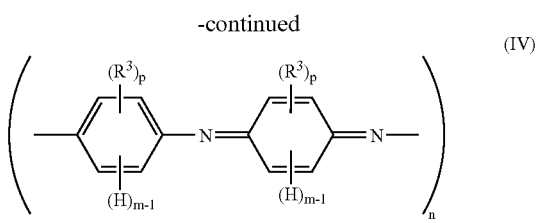

wherein:

n is at least about 4;

p is an integer from 0 to 4;

m is an integer from 1 to 5, with the proviso that p+m=5; and $R^3$ is independently selected so as to be the same or different at each occurrence and is selected from alkyl, alkenyl, alkoxy, cycloalkyl, cycloalkenyl, alkanoyl, alkythio, aryloxy, alkylthioalkyl, alkylaryl, arylalkyl, amino, alkylamino, dialkylamino, aryl, alkylsulfinyl, alkoxyalkyl, alkylsulfonyl, arylthio, arylsulfinyl, alkoxycarbonyl, arylsulfonyl, carboxylic acid, halogen, cyano, or alkyl substituted with one or more of sulfonic acid, carboxylic acid, halo, nitro, cyano or epoxy moieties; or any two $R^3$ groups together may form an alkylene or alkenylene chain completing a 3, 4, 5, 6, or 7-membered aromatic or alicyclic ring, which ring may optionally include one or more divalent nitrogen, sulfur or oxygen atoms.

In one embodiment, the polyaniline is unsubstituted and p=0.

The electrically conductive polymers are doped with at least one anion. As used herein, the term "doped" refers to the formation of an ion pair wherein the negative charge on a dopant balances the positive charge on a conductive polymer.

The polythiophene and polypyrrole polymers formed by oxidative polymerization are positively charged. In the conductive form of polyaniline at least some of the nitrogens are protonated, so that it also is positively charged. The positive charges are balanced by the negative charge of the dopant. In one embodiment the dopant is an organic anion. In one embodiment, the dopant is an organic acid anion. The organic acid can be polymeric or non-polymeric. The acids are selected to be soluble in the polymer ization medium for the conductive polymer, and accordingly, can be water-soluble or organic solvent soluble. The acid anions can be selected from sulfonates, carboxylates, phosphates, phosphonates, acrylates, and mixtures thereof. In one embodiment, the acid is a sulfonic acid. In one embodiment, the acid is a water-soluble acid or organic-soluble acid selected from a non-polymeric organic acid, a water soluble polymeric acid, and combinations thereof.

Examples of polymeric organic acids include, but are not limited to, poly(styrenesulfonic acid) (PSSA), and poly(2-acrylamido-2-methyl-1-propanesulfonic acid) ("PMMPSA"). The corresponding acid anions are the sulfonates, "PSS" and "PMMPS". Examples of suitable non-polymeric acids include, but are not limited to, acetic acid, p-toluenesulfonic acid, camphorsulfonic acid, p-dodecylbenzenesulfonic acid, methanesulfonic acid, trifluoromethanesulfonic acid, and the like. The corresponding acid anions are acetate, p-toluenesulfonate, camphorsulfonate, p-dodecylbenzenesulfonate, methanesulfonate, and trifluoromethanesulfonate. Mixtures of acid anions can be used.

The combination of the positively charged conductive polymer and the anion will be hereinafter referred to as the "doped conductive polymer."

Colloid-forming polymeric acids contemplated for use in the new compositions are insoluble in the non-aqueous liquid medium, and form colloids when dispersed into the non-aqueous medium. The polymeric acids typically have a molecular weight in the range of about 10,000 to about 4,000,000.

In one embodiment, the polymeric acids have a molecular weight of about 100,000 to about 2,000,000. Polymeric acid colloid particle size typically ranges from about 2 nanometers (nm) to about 140 nm. In one embodiment, the colloids have a particle size of about 2 nm to about 30 nm.

Any polymeric acid that is colloid-forming when dispersed in the non-aqueous liquid medium is suitable for use to make the new compositions. In one embodiment, the colloid-forming polymeric acid comprises at least one polymeric acid selected form polymer sulfonic acid, polymeric phosphoric acids, polymeric phosphonic acids, polymeric carboxylic acids, and polymeric acrylic acids, and mixtures thereof. In another embodiment, the polymeric sulfonic acid is fluorinated. In still another embodiment, the colloid-forming polymeric sulfonic acid is perfluorinated. In yet another embodiment, the colloid-forming polymeric sulfonic acid comprises a perfluoroalkylenesulfonic acid.

In still another embodiment, the colloid-forming polymeric acid comprises a highly-fluorinated sulfonic acid polymer ("FSA polymer"). "Highly fluorinated" means that at least about 50% of the total number of halogen and hydrogen atoms in the polymer are fluorine atoms, an in one embodiment at least about 75%, and in another embodiment at least about 90%. In one embodiment, the polymer is perfluorinated. The term "sulfonate functional group" refers to either to sulfonic acid groups or salts of sulfonic acid groups, and in one embodiment alkali metal or ammonium salts. The functional group is represented by the formula $-SO_3X$ where X is a cation, also known as a "counterion". X may be H, Li, Na, K or $N(R_1)(R_2)(R_3)(R_4)$, and $R_1, R_2, R_3,$ and $R_4$ are the same or different and are and in one embodiment H, $CH_3$ or $C_2H_5$. In another embodiment, X is H, in which case the polymer is said to be in the "acid form". X may also be multivalent, as represented by such ions as $Ca^{++}$, and $Al^{+++}$. It is clear to the skilled artisan that in the case of multivalent counterions, represented generally as $M^{n+}$, the number of sulfonate functional groups per counterion will be equal to the valence "n".

In one embodiment, the FSA polymer comprises a polymer backbone with recurring side chains attached to the backbone, the side chains carrying cation exchange groups. Polymers include homopolymers or copolymers of two or more monomers. Copolymers are typically formed from a non-functional monomer and a second monomer carrying the cation exchange group or its precursor, e.g., a sulfonyl fluoride group ($-SO_2F$), which can be subsequently hydrolyzed to a sulfonate functional group. For example, copolymers of a first fluorinated vinyl monomer together with a second fluorinated vinyl monomer having a sulfonyl fluoride group ($-SO_2F$) can be used. Possible first monomers include tetrafluoroethylene (TFE), hexafluoropropylene, vinyl fluoride, vinylidine fluoride, trifluoroethylene, chlorotrifluoroethylene, perfluoro(alkyl vinyl ether), and combinations thereof. TFE is a preferred first monomer.

In other embodiments, one other monomer includes fluorinated vinyl ethers with sulfonate functional groups or precursor groups which can provide the desired side chain in the polymer. Additional monomers, including ethylene, propylene, and $R-CH=CH_2$ where R is a perfluorinated alkyl group of 1 to 10 carbon atoms, can be incorporated into these polymers if desired. The polymers may be of the type referred to herein as random copolymers, that is copolymers made by polymerization in which the relative concentrations of the co-monomers are kept as constant as possible, so that the distribution of the monomer units along the polymer chain is in accordance with their relative concentrations and relative reactivities. Less random copolymers, made by varying relative concentrations of monomers in the course of the polymerization, may also be used. Polymers of the type called block copolymers, such as that disclosed in European Patent Application No. 1 026 152 A1, may also be used.

In one embodiment, FSA polymers for use in the new composition include a highly fluorinated, and in one embodiment perfluorinated, carbon backbone and side chains represented by the formula

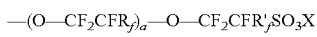

wherein Rf and R'f are independently selected from F, Cl or a perfluorinated alkyl group having 1 to 10 carbon atoms, a=0,1 or 2, and X is H, Li, Na, K or N(R1)(R2)(R3)(R4) and R1, R2, R3, and R4 are the same or different and are and in one embodiment H, $CH_3$ or $C_2H_5$. In another embodiment X is H. As stated above, X may also be multivalent.

In one embodiment, the FSA polymers include, for example, polymers disclosed in U.S. Pat. No. 3,282,875 and in U.S. Pat. Nos. 4,358,545 and 4,940,525. An example of preferred FSA polymer comprises a perfluorocarbon backbone and the side chain represented by the formula

—O—$CF_2$CF($CF_3$)—O—$CF_2CF_2SO_3$X where X is as defined above. FSA polymers of this type are disclosed in U.S. Pat. No. 3,282,875 and can be made by copolymerization of tetrafluoroethylene (TFE) and the perfluorinated vinyl ether $CF_2$=CF—O—$CF_2$CF($CF_3$)—O—$CF_2CF_2SO_2F$, perfluoro(3,6-dioxa-4-methyl-7-octenesulfonyl fluoride) (PDMOF), followed by conversion to sulfonate groups by hydrolysis of the sulfonyl fluoride groups and ion exchanged as necessary to convert them to the desired ionic form. An example of a polymer of the type disclosed in U.S. Pat. Nos. 4,358,545 and 4,940,525 has the side chain —O—$CF_2CF_2SO_3$X, wherein X is as defined above. This polymer can be made by copolymerization of tetrafluoroethylene (TFE) and the perfluorinated vinyl ether $CF_2$=CF—O—$CF_2CF_2SO_2F$, perfluoro(3-oxa-4-pentenesulfonyl fluoride) (POPF), followed by hydrolysis and further ion exchange as necessary.

In one embodiment, the FSA polymers for use in the new composition typically have an ion exchange ratio of less than about 33. In this application, "ion exchange ratio" or "IXR" is defined as number of carbon atoms in the polymer backbone in relation to the cation exchange groups. Within the range of less than about 33, IXR can be varied as desired for the particular application. In one embodiment, the IXR is about 3 to about 33, and in another embodiment about 8 to about 23.

The cation exchange capacity of a polymer is often expressed in terms of equivalent weight (EW). For the purposes of this application, equivalent weight (EW) is defined to be the weight of the polymer in acid form required to neutralize one equivalent of sodium hydroxide. In the case of a sulfonate polymer where the polymer has a perfluorocarbon backbone and the side chain is —O—$CF_2$—CF($CF_3$)—O—$CF_2$—$CF_2$—$SO_3$H (or a salt thereof), the equivalent weight range which corresponds to an IXR of about 8 to about 23 is about 750 EW to about 1500 EW. IXR for this polymer can be related to equivalent weight using the formula: 50 IXR+344=EW. While the same IXR range is used for sulfonate polymers disclosed in U.S. Pat. Nos. 4,358,545 and 4,940,525, e.g., the polymer having the side chain —O—$CF_2CF_2SO_3$H (or a salt thereof), the equivalent weight is somewhat lower because of the lower molecular weight of the monomer unit containing a cation exchange group. For the preferred IXR range of about 8 to about 23, the corresponding equivalent weight range is about 575 EW to about 1325 EW. IXR for this polymer can be related to equivalent weight using the formula: 50 IXR+178=EW.

The synthesis of FSA polymers is well known. The FSA polymers can be prepared as colloidal aqueous dispersions. They may also be in the form of dispersions in other media, examples of which include, but are not limited to, alcohol, water miscible liquids, such as tetrahydrofuran, mixtures of water-soluble ethers, and combinations thereof. In making the new compositions, the polymer can be used in acid form. In one embodiment, the water in the aqueous FSA dispersions is removed prior to or after combination with the conductive polymers. U.S. Pat. Nos. 4,433,082, 6,150,426 and WO 03/006537 disclose methods for making of aqueous dispersions. After the dispersion is made, the concentration and the dispersing liquid composition can be adjusted by methods known in the art.

In one embodiment, aqueous dispersions of the colloid-forming polymeric acids, including FSA polymers, have particle sizes as small as possible and an EW as small as possible, so long as a stable colloid is formed.

Aqueous dispersions and non-aqueous dispersions of FSA polymer, are available commercially under the trademark Nafion® from E. I. du Pont de Nemours and Company (Wilmington, Del.). Dispersible solids of FSA polymer can be prepared from aqueous or non-aqueous dispersions, by removing the liquid medium at a temperature less than the coalescence temperature of the FSA compositions, as described in U.S. Pat. No. 6,150,426. By "coalescence temperature" is meant the temperature at which a dried solid of the FSA polymer is cured to a stable solid which is not redispersible in water or other polar solvent. A typical coalescence temperature can be about 175° C. Methods of removing the liquid medium include, but are not limited to, heating to a temperature less than about 100° C., freeze-drying, and spray drying.

The non-aqueous liquid medium of the new composition comprises at least 60% by weight of organic liquid, and less than 40% by weight water. In one embodiment, the liquid medium comprises at least 70% by weight of organic liquid. In one embodiment, the liquid medium comprises at least 90% by weight organic liquid. Examples of suitable organic liquids include, but are not limited to, ethers, cyclic ethers, alcohols, polyols, alcohol ethers, ketones, nitriles, sulfides, sulfoxides, amides, amines, carboxylic acids, and the like, as well as combinations of any two or more thereof. In one embodiment, the organic liquid is selected from dimethylacetamide ("DMAc"), N-methylpyrrolidone ("NMP"), dimethylformamide ("DMF"), ethylene glycol ("EG"), aliphatic alcohols, and mixtures thereof.

In one embodiment, the new composition is made by dispersing doped conductive polymer solids and colloid-forming polymeric acid solids in a non-aqueous liquid medium. In one embodiment, the new composition is made by dispersing colloid-forming polymeric acid solids in a non-aqueous solution or a non-aqueous dispersion of doped conductive polymer. In one embodiment, the new composition is made by dispersing doped conductive polymer solids in a non-aqueous dispersion of colloid-forming polymeric acid. In one embodiment, the new composition is made by combining a non-aqueous solution, emulsion or dispersion of doped conductive polymer with a non-aqueous dispersion of colloid-forming polymeric acid. The two non-aqueous media can be the same or different, as long as they are miscible with each other in the desired proportions. In any of the above embodiments, the materials can be blended using sonication or microfluidization to ensure adequate mixing of the components.

The synthesis of thiophene, pyrrole, and aniline polymers is well known and has been extensively described. Polymerization of thiophene monomers has been described in, for example, U.S. Pat. No. 5,300,575. Polymerization of aniline monomers has been described in, for example, U.S. Pat. No. 5,798,170.

In one embodiment, the doped conductive polymer is made by oxidative polymerization of the monomer or monomers to form the conductive polymer, in the presence of a soluble acid. The acid can be a polymeric or non-polymeric acid. The polymerization is generally carried out in a homogeneous solution. In one embodiment, the polymerization is carried out in a homogeneous aqueous solution. In another embodiment, the polymerization for obtaining the electrically conducting polymer is carried out in an emulsion of water and an organic solvent. In general, some water is present in order to obtain adequate solubility of the oxidizing agent and/or catalyst. Oxidizing agents such as ammonium persulafate, sodium persulfate, potassium persulfate, and the like, can be used. A catalyst, such as ferric chloride, or ferric sulfate may also be present. The resulting polymerized product will be a solution, dispersion, or emulsion of the doped conductive polymer. Aqueous dispersions of polypyrrole and a non-polymeric organic acid anion are available commercially from Sigma-Aldrich (St. Louis, Mo.). Aqueous dispersions of poly (2,3-ethylendioxythiophene)/PSSA are available commercially from H. C. Starck, GmbH. (Leverkusen, Germany). Aqueous and non-aqueous dispersions of doped polyaniline, and doped polyaniline solids are available commercially from Covion Organic Semiconductors GmbH (Frankfurt, Germany) or Ormecon (Ambersbek, Germany).

Doped conductive polymer solids can be obtained from the solution, dispersion or emulsion of doped conductive polymer by any conventional technique. Such techniques include, but are not limited to evaporative drying, spray drying, flash drying, centrifugation, precipitation by a non-solvent followed by filtration, freeze-drying, and the like. In one embodiment, the solids are only partially dried to facilitate dispersion in an organic liquid.

Colloid-forming polymeric acid solids can similarly be obtained from aqueous or non-aqueous dispersions of the colloid-forming polymeric acids.

Dispersions of electrically conductive polymers generally have a fairly low pH due to the presence of acids in the oxidative polymerization process. For example, aqueous poly (ethylenedioxythiophene) ("PEDT") dispersions, Baytron®-P VP Al 4083 and CH8000, from H. C. Starck, GmbH, Leverkusen, Germany have a pH below 2. It is frequently desirable to have aqueous dispersions of conductive polymers with a higher pH, as the acidity can be corrosive. With Baytron-P, adjusting the pH to higher levels, e.g., above 2, can have a deleterious effect on the electrical properties of the conductive polymer and their functional effectiveness when used in a buffer layer in OLEDs. In new compositions comprising non-aqueous dispersions of at least one electrically conducting doped polymer and at least one colloid-forming polymeric acid, it has been found that the pH can be adjusted without sacrificing electrical properties. The pH can be adjusted using known techniques, for example, by contact with ion exchange resins, by titration with an aqueous basic solution or with solid alkaline hydroxide. Stable dispersions of doped conductive polymers and at least one colloid-forming polymeric acid can be formed with a pH adjusted from 1 to 8. Adjusting the pH to higher, more neutral values, does not deleteriously affect the electrical properties and device performance of the conductive polymers in the new composition, and in most cases improves those properties. The pH can be adjusted at any point after polymerization of the conductive polymer. In one embodiment, the as-synthesized conductive polymer is treated to adjust the pH before isolation from the polymerization medium. In one embodiment, the conductive polymer is treated to adjust the pH after re-dispersion in a non-aqueous medium, before or after it is combined with the colloid-forming polymeric acid.

In one embodiment, the conductive polymer dispersion is contacted with at least one ion exchange resin under conditions suitable to remove decomposed species, side reaction products, unreacted monomers, and ionic impurities, and to adjust pH. The ion exchange treatment can be carried out at any point after polymerization of the conductive polymer. In one embodiment, the as-synthesized conductive polymer is treated with at least one ion exchange resin. In one embodiment, the conductive polymer is treated with at least one ion exchange resin after re-dispersion in a non-aqueous medium, before or after it is combined with the colloid-forming polymeric acid. The conductive polymer dispersion can be contacted with at least one ion exchange resin before or after the addition of a co-dispersing liquid. In one embodiment, the dispersion is contacted with a first ion exchange resin and a second ion exchange resin.

In another embodiment, the first ion exchange resin is an acidic, cation exchange resin, such as a sulfonic acid cation exchange resin set forth above, and the second ion exchange resin is a basic, anion exchange resin, such as a tertiary amine or a quaternary exchange resin.

Ion exchange is a reversible chemical reaction wherein an ion in a fluid medium (such as a non-aqueous dispersion) is exchanged for a similarly charged ion attached to an immobile solid particle that is insoluble in the fluid medium. The term "ion exchange resin" is used herein to refer to all such substances. The resin is rendered insoluble due to the crosslinked nature of the polymeric support to which the ion exchanging groups are attached. Ion exchange resins are classified as acidic, cation exchangers, which have positively charged mobile ions available for exchange, and basic, anion exchangers, whose exchangeable ions are negatively charged.

Both acidic, cation exchange resins and basic, anion exchange resins are contemplated for use in the new process. In one embodiment, the acidic, cation exchange resin is an organic acid, cation exchange resin, such as a sulfonic acid cation exchange resin. Sulfonic acid cation exchange resins contemplated for use in the new composition include, for example, sulfonated styrene-divinylbenzene copolymers, sulfonated crosslinked styrene polymers, phenol-formaldehyde-sulfonic acid resins, benzene-formaldehyde-sulfonic acid resins, and mixtures thereof. In another embodiment, the acidic, cation exchange resin is an organic acid, cation exchange resin, such as carboxylic acid, acrylic or phosphoric acid cation exchange resin. In addition, mixtures of different cation exchange resins can be used. In many cases, the basic ion exchange resin can be used to adjust the pH to the desired level. In some cases, the pH can be further adjusted with an aqueous basic solution such as a solution of sodium hydroxide, ammonium hydroxide, or the like.

In another embodiment, the basic, anionic exchange resin is a tertiary amine anion exchange resin. Tertiary amine anion exchange resins contemplated for use in the new compositions include, for example, tertiary-aminated styrene-divinylbenzene copolymers, tertiary-aminated crosslinked styrene polymers, tertiary-aminated phenol-formaldehyde resins, tertiary-aminated benzene-formaldehyde resins, and mixtures thereof. In a further embodiment, the basic, anionic exchange resin is a quaternary amine anion exchange resin, or mixtures of these and other exchange resins.

The first and second ion exchange resins may contact the doped conductive polymer dispersion either simultaneously, or consecutively. For example, in one embodiment both resins are added simultaneously to a doped conductive polymer dispersion, and allowed to remain in contact with the dispersion for at least about 1 hour, e.g., about 2 hours to about 20 hours. The ion exchange resins can then be removed from the dispersion by filtration. The size of the filter is chosen so that the relatively large ion exchange resin particles will be removed while the smaller dispersion particles will pass through. The basic, anion exchange and/or acidic, cation exchange resins renders the acidic sites more basic, resulting in increased pH of the dispersion. In general, at least 1 gram of ion exchange is used per about 1 gram of composition solids, for example, PEDT/PSSA. In other embodiments, the use of the ion exchange resin is used in a ratio of up to about 5 grams of ion exchange resin to composition solids, and depends on the pH that is to be achieved. In one embodiment, about one gram of Lewatit® MP62 WS, a weakly basic anion exchange resin from Bayer GmbH, and about one gram of Lewatit® MonoPlus S100, a strongly acidic, sodium cation exchange resin from Bayer, GmbH, are used per gram of solids in the new composition.

In another embodiment, more conductive dispersions are formed by the addition of highly conductive additives to the non-aqueous dispersions of conductive polymer and colloid-forming polymeric acid. In one embodiment, new compositions with relatively high pH can be formed, and further comprise the conductive additives, especially metal additives, which are not attacked by the acid in the dispersion.

In one embodiment, the new composition further comprises at least one conductive additive at a weight percentage sufficient to reach the percolation threshold. Examples of suitable conductive additives include, but are not limited to conductive polymers, metal particles and nanoparticles, metal nanowires, carbon nanotubes, carbon nanopoarticles, graphite fibers or particles, carbon particles, and combinations thereof. A dispersing agent may be included to facilitate dispersing of the conductive additives.

In one embodiment, the new compositions are deposited to form electrically conductive or semiconductive layers which are used alone, or in combination with other electroactive materials, as electrodes, electroactive elements, photoactive elements, or bioactive elements. As used herein, the terms "electroactive element", "photoactive element" and "bioactive element" refer to elements which exhibit the named activity in response to a stimulus, such as an electromagnetic field, an electrical potential, solar energy radiation, and a biostimulation field.

In one embodiment, the new compositions are deposited to form buffer layers in an electronic device. The term "buffer layer" as used herein, is intended to mean an electrically conductive or semiconductive layer which can be used between an anode and an active organic material. A buffer layer is believed to accomplish one or more function in an organic electronic device, including, but not limited to planarization of the underlying layer, hole transport, hole injection, scavenging of impurities, such as oxygen and metal ions, among other aspects to facilitate or to improve the performance of an organic electronic device.

The term "layer" or "film" refers to a coating covering a desired area. The area can be as large as an entire device or as small as a specific functional area such as the actual visual display, or as small as a single sub-pixel. Films can be formed by any conventional deposition technique, including vapor deposition and liquid deposition. Typical liquid deposition techniques include, but are not limited to, continuous deposition techniques such as spin coating, gravure coating, curtain coating, dip coating, slot-die coating, spray coating, and continuous nozzle coating; and discontinuous deposition techniques such as ink jet printing, gravure printing, and screen printing.

In one embodiment, there are provided buffer layers deposited from non-aqueous dispersions comprising doped conductive polymers and colloid-forming polymeric acids. In one embodiment, the buffer layers are deposited from non-aqueous dispersions comprising colloid-forming polymeric sulfonic acid. In one embodiment, the buffer layer is deposited from a non-aqueous dispersion containing doped conductive polymer and fluorinated polymeric acid colloids. In another embodiment, the fluorinated polymeric acid colloids are fluorinated polymeric sulfonic acid colloids. In still another embodiment, the buffer layer is deposited from a non-aqueous dispersion containing doped conductive polymer and perfluoroethylenesulfonic acid colloids.

In one embodiment, the dried layers of the new composition are generally not redispersible in water or non-aqueous liquids from which they have been formed. In one embodiment, the organic device comprising at least one layer made from the new composition is made of multiple thin layers. In one embodiment, the layer can be further overcoated with a layer of different water-soluble or water-dispersible material without substantial damage to the layer's functionality or performance in an organic electronic device.

In another embodiment, there are provided buffer layers deposited from non-aqueous dispersions comprising at least one doped conductive polymer and at least one colloid-forming polymeric acid, blended with other materials which are soluble or dispersible in the liquid medium. Depending on the final application of the material, examples of types of materials which can be added include, but are not limited to polymers, dyes, coating aids, carbon nanotubes, metal nanowires and nanoparticles, organic and inorganic conductive inks and pastes, charge transport materials, piezoelectric, pyroelectric, or ferroelectric oxide nano-particles or polymers, photoconductive oxide nanoparticles or polymers, dispersing agents, crosslinking agents, and combinations thereof. The materials can be simple molecules or polymers. Examples of suitable other polymers include, but are not limited to, polyacrylamide, polyvinylalcohol, poly(2-vinylpridine), poly(vinylacetate), poly(vinylmethylether), poly(vinylpyrrolidone), poly (vinylbutyral), poly(styrenesulfonic acid, and conductive polymers such as polythiophenes, polyanilines, polyamines, polypyrroles, polyacetylenes, and combinations thereof.

In another embodiment, there are provided electronic devices comprising at least one electrically conductive or semiconductive layer made from the new composition. Organic electronic devices that may benefit from having one or more layers comprising the composition of at least one doped conductive polymer and at least one colloid-forming polymeric acid include, but are not limited to, (1) devices that convert electrical energy into radiation (e.g., a light-emitting diode, light emitting diode display, or diode laser), (2) devices that detect signals through electronics processes (e.g., photodetectors, photoconductive cells, photoresistors, photoswitches, phototransistors, phototubes, IR detectors), (3) devices that convert radiation into electrical energy, (e.g., a photovoltaic device or solar cell), and (4) devices that include one or more electronic components that include one or more organic semi-conductor layers (e.g., a transistor or diode). Other uses for the new compositions include coating materials for memory storage devices, antistatic films, biosensors, electrochromic devices, solid electrolyte capacitors, energy storage devices such as a rechargeable battery, and electromagnetic shielding applications.

In one embodiment, the organic electronic device comprises an electroactive layer positioned between two electrical contact layers, wherein at least one of the layers of the device includes the new buffer layer. One embodiment is illustrated in one type of OLED device, as shown in FIG. 1, which is a device that has anode layer 110, a buffer layer 120, an electroluminescent layer 130, and a cathode layer 150. Adjacent to the cathode layer 150 is an optional electron-injection/transport layer 140. Between the buffer layer 120 and the cathode layer 150 (or optional electron injection/transport layer 140) is the electroluminescent layer 130.

The device may include a support or substrate (not shown) that can be adjacent to the anode layer 110 or the cathode layer 150. Most frequently, the support is adjacent the anode layer 110. The support can be flexible or rigid, organic or inorganic. Generally, glass or flexible organic films are used as a support. The anode layer 110 is an electrode that is more efficient for injecting holes compared to the cathode layer 150. The anode can include materials containing a metal, mixed metal, alloy, metal oxide or mixed oxide. Suitable materials include the mixed oxides of the Group 2 elements (i.e., Be, Mg, Ca, Sr, Ba, Ra), the Group 11 elements, the elements in Groups 4, 5, and 6, and the Group 8-10 transition elements. If the anode layer 110 is to be light transmitting, mixed oxides of Groups 12,13 and 14 elements, such as indium-tin-oxide, may be used. As used herein, the phrase "mixed oxide" refers to oxides having two or more different cations selected from the Group 2 elements or the Groups 12, 13, or 14 elements. Some non-limiting, specific examples of materials for anode layer 110 include, but are not limited to, indium-tin-oxide ("ITO"), aluminum-tin-oxide, gold, silver, copper, and nickel. The anode may also comprise an organic material such as polyaniline, polythiophene, or polypyrrole. The IUPAC number system is used throughout, where the groups from the Periodic Table are numbered from left to right as 1-18 (CRC Handbook of Chemistry and Physics, 81$^{st}$ Edition, 2000).

The anode layer 110 may be formed by a chemical or physical vapor deposition process or spin-coating process. Chemical vapor deposition may be performed as a plasma-enhanced chemical vapor deposition ("PECVD") or metal organic chemical vapor deposition ("MOCVD"). Physical vapor deposition can include all forms of sputtering, including ion beam sputtering, as well as e-beam evaporation and resistance evaporation. Specific forms of physical vapor deposition include rf magnetron sputtering and inductively-coupled plasma physical vapor deposition ("IMP-PVD"). These deposition techniques are well known within the semiconductor fabrication arts.

The anode layer 110 may be patterned during a lithographic operation. The pattern may vary as desired. The layers can be formed in a pattern by, for example, positioning a patterned mask or resist on the first flexible composite barrier structure prior to applying the first electrical contact layer material. Alternatively, the layers can be applied as an overall layer (also called blanket deposit) and subsequently patterned using, for example, a patterned resist layer and wet chemical or dry etching techniques. Other processes for patterning that are well known in the art can also be used. When the electronic devices are located within an array, the anode layer 110 typically is formed into substantially parallel strips having lengths that extend in substantially the same direction.

The buffer layer 120 can be deposited onto substrates using any technique well-known to those skilled in the art.

The electroluminescent (EL) layer 130 may typically be any organic EL material, including, but not limited to, fluorescent dyes, fluorescent and phosphorescent metal complexes, conjugated polymers, and mixtures thereof. Examples of fluorescent dyes include, but are not limited to, pyrene, perylene, rubrene, derivatives thereof, and mixtures thereof. Examples of metal complexes include, but are not limited to, metal chelated oxinoid compounds, such as tris(8-hydroxyquinolato)aluminum (Alq3); cyclometalated iridium and platinum electroluminescent compounds, such as complexes of Iridium with phenylpyridine, phenylquinoline, or phenylpyrimidine ligands as disclosed in Petrov et al., Published PCT Application WO 02/02714, and organometallic complexes described in, for example, published applications US 2001/0019782, EP 1191612, WO 02/115645, and EP 1191614; and mixtures thereof. Electroluminescent emissive layers comprising a charge carrying host material and a metal complex have been described by Thompson et al., in U.S. Pat. No. 6,303,238, and by Burrows and Thompson in published PCT applications WO 00/70655 and WO 01/41512. Examples of conjugated polymers include, but are not limited to poly(phenylenevinylenes), polyfluorenes, poly(spirobifluorenes), polythiophenes, poly(p-phenylenes), copolymers thereof, and mixtures thereof.

The particular material chosen may depend on the specific application, potentials used during operation, or other factors. The EL layer 130 containing the electroluminescent organic material can be applied using any number of techniques including vapor deposition, solution processing techniques or thermal transfer. In another embodiment, an EL polymer precursor can be applied and then converted to the polymer, typically by heat or other source of external energy (e.g., visible light or UV radiation).

Optional layer 140 can function both to facilitate electron injection/transport, and can also serve as a confinement layer to prevent quenching reactions at layer interfaces. More specifically, layer 140 may promote electron mobility and reduce the likelihood of a quenching reaction if layers 130 and 150 would otherwise be in direct contact. Examples of materials for optional layer 140 include, but are not limited to, metal-chelated oxinoid compounds (e.g., Alq$_3$ or the like); phenanthroline-based compounds (e.g., 2,9-dimethyl-4,7-diphenyl-1,10-phenanthroline ("DDPA"), 4,7-diphenyl-1,10-phenanthroline ("DPA"), or the like); azole compounds (e.g., 2-(4-biphenylyl)-5-(4-t-butylphenyl)-1,3,4-oxadiazole ("PBD" or the like), 3-(4-biphenylyl)-4-phenyl-5-(4-t-butylphenyl)-1,2,4-triazole ("TAZ" or the like); other similar compounds; or any one or more combinations thereof. Alternatively, optional layer 140 may be inorganic and comprise BaO, LiF, Li$_2$O, or the like.

The cathode layer 150 is an electrode that is particularly efficient for injecting electrons or negative charge carriers. The cathode layer 150 can be any metal or nonmetal having a lower work function than the first electrical contact layer (in this case, the anode layer 110). As used herein, the term "lower work function" is intended to mean a material having a work function no greater than about 4.4 eV. As used herein, "higher work function" is intended to mean a material having a work function of at least approximately 4.4 eV.

Materials for the cathode layer can be selected from alkali metals of Group 1 (e.g., Li, Na, K, Rb, Cs,), the Group 2 metals (e.g., Mg, Ca, Ba, or the like), the Group 12 metals, the lanthanides (e.g., Ce, Sm, Eu, or the like), and the actinides (e.g., Th, U, or the like). Materials such as aluminum, indium, yttrium, and combinations thereof, may also be used. Specific non-limiting examples of materials for the cathode layer 150 include, but are not limited to, barium, lithium, cerium, cesium, europium, rubidium, yttrium, magnesium, samarium, and alloys and combinations thereof.

The cathode layer 150 is usually formed by a chemical or physical vapor deposition process. In general, the cathode layer will be patterned, as discussed above in reference to the anode layer 110. If the device lies within an array, the cathode layer 150 may be patterned into substantially parallel strips, where the lengths of the cathode layer strips extend in substantially the same direction and substantially perpendicular to the lengths of the anode layer strips. Electronic elements called pixels are formed at the cross points (where an anode layer strip intersects a cathode layer strip when the array is seen from a plan or top view).

In other embodiments, additional layer(s) may be present within organic electronic devices. For example, a layer (not shown) between the buffer layer 120 and the EL layer 130 may facilitate positive charge transport, band-gap matching of the layers, function as a protective layer, or the like. Similarly, additional layers (not shown) between the EL layer 130 and the cathode layer 150 may facilitate negative charge transport, band-gap matching between the layers, function as a protective layer, or the like. Layers that are known in the art can be used. In addition, any of the above-described layers can be made of two or more layers. Alternatively, some or all of inorganic anode layer 110, the buffer layer 120, the EL layer 130, and cathode layer 150, may be surface treated to increase charge carrier transport efficiency. The choice of materials for each of the component layers may be determined by balancing the goals of providing a device with high device efficiency with the cost of manufacturing, manufacturing complexities, or potentially other factors.

The different layers may have any suitable thickness. In one embodiment, inorganic anode layer 110 is usually no greater than approximately 500 nm, for example, approximately 10-200 nm; buffer layer 120, is usually no greater than approximately 250 nm, for example, approximately 50-200 nm; EL layer 130, is usually no greater than approximately 100 nm, for example, approximately 50-80 nm; optional layer 140 is usually no greater than approximately 100 nm, for example, approximately 20-80 nm; and cathode layer 150 is usually no greater than approximately 100 nm, for example, approximately 1-50 nm. If the anode layer 110 or the cathode layer 150 needs to transmit at least some light, the thickness of such layer may not exceed approximately 100 nm.

In organic light emitting diodes (OLEDs), electrons and holes, injected from the cathode 150 and anode 110 layers, respectively, into the EL layer 130, form negative and positively charged polar ions in the polymer. These polar ions migrate under the influence of the applied electric field, forming a polar ion exciton with an oppositely charged species and subsequently undergoing radiative recombination. A sufficient potential difference between the anode and cathode, usually less than approximately 12 volts, and in many instances no greater than approximately 5 volts, may be applied to the device. The actual potential difference may depend on the use of the device in a larger electronic component. In many embodiments, the anode layer 110 is biased to a positive voltage and the cathode layer 150 is at substantially ground potential or zero volts during the operation of the electronic device. A battery or other power source(s) may be electrically connected to the electronic device as part of a circuit but is not illustrated in FIG. 1.

In one embodiment a pH neutral composition is used in at least one layer of an electronic device. In one OLED embodiment, the pH is adjusted so as to reduce etching of the ITO layer during device fabrication and hence much lower concentration of In and Sn ions diffusing into the polymer layers of the OLED. Since In and Sn ions are suspected to contribute to reduced operating lifetime this is a significant benefit. The lower acidity also reduces corrosion of the metal components of the display (e.g. electrical contact pads) during fabrication and over the long-term storage. PEDT/PSSA residues will interact with residual moisture to release acid into the displays with resulting slow corrosion.

The layer in an organic electronic device comprising the new composition may further comprise a layer of conductive polymer applied from aqueous solution or solvent. The conductive polymer can facilitate charge transfer and also improve coatability. Examples of suitable conductive polymers include, but are not limited to, polyanilines, polythiophenes, polydioxythiophene/polystyrenesulfonic acid, polyaniline/polymeric-acid-colloids such as those disclosed in co-pending application Ser. No. 10/669577, polythiophene/polymeric-acid-colloids such as those disclosed in co-pending application Ser. No. 10/669494, polypyrroles, polyacetylenes, and combinations thereof. The composition comprising such a layer may further comprise conductive polymers, and may also comprise dyes, carbon nanotubes, carbon nanoparticles, metal nanowires, metal nanoparticles, carbon fibers and particles, graphite fibers and particles, coating aids, organic and inorganic conductive inks and pastes, charge transport materials, semiconductive or insulating inorganic oxide particles, piezoelectric, pyroelectric, or ferroelectric oxide nano-particles or polymers, photoconductive oxide nanoparticles or polymers, dispersing agents, crosslinking agents and combinations thereof. These materials can be added to the new composition either before or after combination of the doped conductive polymer and colloid-forming polymeric acid and/or before or after treatment with at least one ion exchange resin.

In one embodiment, there are provided thin film field effect transistors comprising electrodes made from the new composition. For use as electrodes in thin film field effect transistors, the conducting polymers and the liquids for dispersing or dissolving the conducting polymers must be compatible with the semiconducting polymers and the solvents for the semiconducting polymers to avoid re-dissolution of either conducting polymers or semiconducting polymers. Thin film field effect transistor electrodes fabricated from conducting polymers should have a conductivity greater than 10 S/cm. However, electrically conducting polymers made with water soluble polymeric acids only provide conductivity in the range of $\sim 10^{-3}$ S/cm or lower. Thus, in one embodiment, the electrodes comprise a doped conductive polymer selected from polythiophenes, polypyrroles, and polyanilines and a fluorinated colloid-forming polymeric sulfonic acid in combination with electrical conductivity enhancers such as metal nanowires, metal nanoparticles, carbon nanotubes, or the like. The new compositions may be used in thin film field effect transistors as gate electrodes, drain electrodes, or source electrodes.

Figure 2:
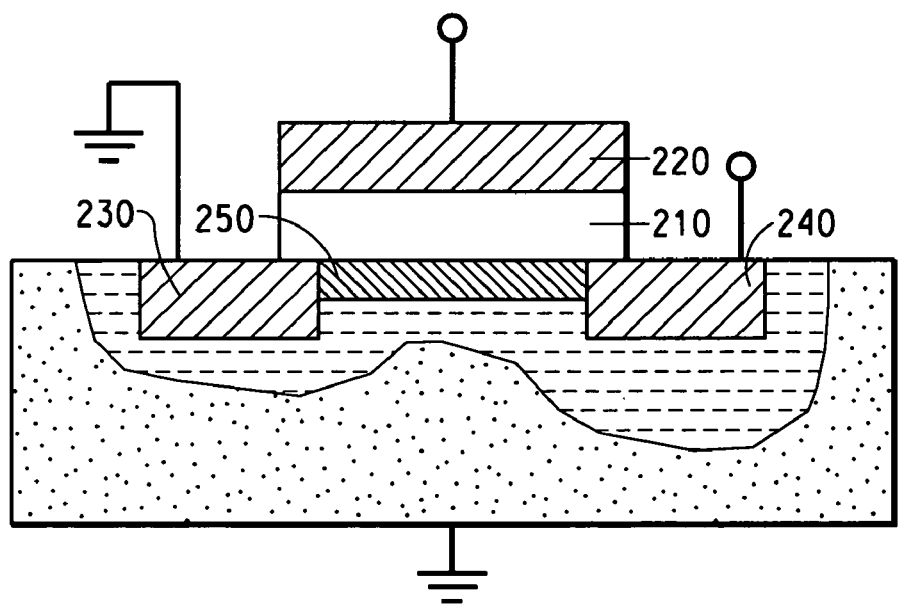
FIG. 2 illustrates a cross-sectional view of a thin film field effect transistor that comprises an electrode comprising one embodiment of the new composition.

Another illustration of a use for the new composition, is the thin film field effect transistors, is shown in FIG. 2. In this illustration, a dielectric polymer or dielectric oxide thin film 210 has a gate electrode 220 on one side and drain and source electrodes, 230 and 240, respectively, on the other side.

Between the drain and source electrode, an organic semiconducting film 250 is deposited. Since the new compositions are a colloidal dispersion, less weight percentage of the conductive fillers is required (relative to compositions containing soluble polymeric acids) to reach percolation threshold for a desired or high electrical conductivity.

In another embodiment, there are provided field effect resistance devices comprising one layer made from the new composition. The field effect resistance devices undergo reversible change of resistance in the conducting polymer films when subjected to a pulse of gate voltage as illustrated in pages 339-343, No. 2, 2002, Current Applied Physics.

In another embodiment, there are provided electrochromic displays comprising at least one layer made from the new composition. Electrochromic displays utilize change of color when thin film of the material is subjected to electrical potential. In one embodiment, the new composition is superior for this application because of the high pH of the dispersion, and the low moisture uptake and water non-dispersibility of dried solid films made from the dispersions.

In yet another embodiment, there are provided memory storage devices comprising silicon chips top-coated with the new composition. For example, a write-once-read-many-times (WORM) memory is known in the arts (Nature, Page 166 to 169, vol 426, 2003). When information is recorded, higher voltages at certain points in the circuit grids of silicon chips destroys the conductive polymer at those points to create "zero" bit data. The conductive polymer at the untouched points remains electrically conductive and becomes "1" bit data.

In another embodiment, the new compositions are used to form coatings for biosensor or electromagnetic shielding applications.

In another embodiment, the new compositions can be used for antistatic coatings for plastic and cathode ray tubes, electrode materials for solid electrolyte capacitors, metal anti-corrosion coatings, through-hole plating of printed circuit boards, photodiodes, bio-sensors, photodetectors, rechargeable batteries, photovoltaic devices, and photodiodes. In addition, examples of other applications for the new compositions can be found in, for example, Advanced Materials, page 490 to 491, vol. 12, No. 7, 2000.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

Also, use of the "a" or "an" are employed to describe elements and components of the invention. This is done merely for convenience and to give a general sense of the invention. This description should be read to include one or at least one and the singular also includes the plural unless it is obvious that it is meant otherwise.

The new compositions and their uses will now be described in greater detail by reference to the following non-limiting examples.

EXAMPLES

Example 1

This example will illustrate preparation of uncoalesced solids of perfluoroethylenesulfonic acid (FSA) dispersions available commercially under the trademark Nafion® from E. I. du Pont de Nemours and Company (Wilmington, Del.).

The following commercial Nafion® dispersions will be used for preparation of uncoalesced solids: DE520 and DE521 (both ~5.0% FSA in 48% n-propanol/~45% water), DE1021 and DE1020 (both ~10% FSA in ~90% water) and the FSA dispersions made using a procedure similar to the procedure in U.S. Pat. No. 6,150,426, Example 1, Part 2, except that the temperature is approximately 270° C. The solids will be obtained by freeze drying. 100° C.

Example 2

This example will illustrate blending of Nafion® with a D1000 PAni dispersion from Ormecon (Ambersbek, Germany), sold by Covion (Frankfurt, Germany), and organic light emitting diodes made therewith.

D1000 PAni from Ormecon is an electrically conducting polyaniline/PSSA ("doped-PAni") dispersed in methanol. An uncoalesced, dried Nafion® polymer solid will be either pre-dispersed in methanol before addition to D1000, or added directly to the D1000 dispersion, to form a non-aqueous dispersion of doped-PAni/Nafion®.

The non-aqueous dispersion of doped-PAni/Nafion® will be spin-coated onto an ITO substrate, and sequentially spin-coated with either light emitting Super Yellow from Covion (Frankfurt, Germany) or Lumination Green from Dow Chemical Company (Midland, Mich., USA). A cathode of Ba/Al will then be vapor deposited on the light-emitting layer. The devices will be tested for device voltage, efficiency, and lifetime for comparison with the device made with as-is D1000 PAni.

A second sample of the dispersion of doped-PAni/Nafion® will also be treated with ion exchange resins or added with a known amount of sodium hydroxide solid to adjust the pH to a higher value for device fabrication and testing.

Example 3

This example will illustrate blending of Nafion®polymer with a non-aqueous PEDT/PSSA dispersion, and organic light emitting diodes made therewith.

Baytron-P from H. C. Starck GmbH (Leverkusen, Germany) is an electrically conducting poly(3,4-ethylenedioxythiophene)/polystyrensulfonic acid, PEDT/PSSA, dispersed in water. The dispersion is acidic having a pH of about 1.7. The doped conductive polymer will be isolated either by spray-drying, freeze-drying or centrifugation. PEDT/PSSA will be kept partially wet to render the solid redispersible in an organic liquid.

An uncoalesced, dried Nafion® polymer will be pre-dispersed in dimethylacetamide (DMAc), n-propanol, or glycol. To this will be added the partially dried solid of doped conductive polymer, PEDT/PSSA, to form a DMAc, n-propanol, or glycol dispersion of PEDT/PSSA/Nafion®.

Alternatively, the partially dried solid PEDT/PSSA polymer will be re-dispersed in DMAc, n-propanol or glycol. To this will be added uncoalesced, dried Nafion® polymer to form a DMAc, n-propanol, or glycol dispersion of PEDT/PSSA/Nafion®.

The non-aqeuous dispersion of PEDT/PSSA/Nafion® will be spin-coated onto an ITO substrate, and sequentially spin-coated with either light-emitting Super Yellow from Covion (Frankfurt, Germany) or Lumination Green from Dow Chemical Company (Midland, Mich., USA). A cathode of Ba/Al will then be vapor deposited on the light-emitting layer. The devices will be tested for device voltage, efficiency, and lifetime for comparison with the device made with Baytron-P.

A second sample of the non-aqeuous dispersion of PEDT/PSSA/Nafion® will also be treated with ion exchange resins or added with sodium hydroxide to adjust the pH to a value higher than 2 for device fabrication and testing.

Example 4

This example will illustrate blending of Nafion® polymer with a non-aqueous polyaniline/PSSA dispersion, and organic light emitting diodes made therewith:

PAni/PSSA polymer was made as follows: 175.05 g PSSA (6.93% in water, ~500K molecular weight) was added to a jacketed 500 mL three-necked flask. This is calculated to be 12.13 g solid PSSA(65.89 mmoles). To the flask, 150 ml deionized water was added. It was left stirred with an Air-Driven Overhead Stirrer and then added with 4.0 g distilled aniline. The reaction mixtures was cooled down to about 5° C. with circulating coolant. 2.32 g ammonium persulfate pre-dissolved in 100 mL deionized water was added slowly to the reaction mixture while it was being stirred rigorously. It took 66 minutes to complete the addition. It was left to polymerize for additional 14 minutes. The reaction mixture was poured into a 250 mL Separatory funnel. In two parts, the supernate was dripped into a beaker that contained 3 L of acetone with agitation being provided by an Air-driven Overhead Stirrer. Acetone was decanted before the precipitate from the second portion was combined. Another 500 mL fresh acetone was added to the combined solids. It was stirred again for another 6 hours and acetone was decanted again. Another 500 mL fresh acetone was added and was stirred for 10 hours and acetone was decanted before another 500 mL fresh acetone was added. It was stirred for another 30 hours. All the decanted actone was clear in color. The slurry was filtered through a Whatman® number 4 filter paper. The filtrate was clear and colorless. The filtered solid was dried in a vacuumm oven (~18 in Hg, nitrogen bleed, ambient temperature) overnight.

The dried solid dispersed easily at ~2% (w/w) in methanol, DMAc, DMF, and NMP readily. To this will be added with an uncoalesced dried Nafion® polymer, to form a non-aqueous dispersion of PAni/PSSA/Nafion®.

Any of the dispersions of PANi/PSSA/Nafion® will be spin-coated onto an ITO substrate, and sequentially spin-coated with either light-emitting Super Yellow from Covion (Frankfurt, Germany) or Lumination Green from Dow Chemical Company (Midland, Mich., USA). A cathode of Ba/Al will then be vapor deposited on the light-emitting layer. The devices will be tested for device voltage, efficiency, and lifetime for comparison with the device made with PAni/PSSA only.

A second sample of the dispersion of PAni/PSSA/Nafion® will also be treated with ion exchange resins or added with sodium hydroxide to adjust the pH to a value higher than 2 for device fabrication and testing.

Example 5

This example will illustrate blending of Nafion® polymer with a non-aqueous polyaniline/dinonylnaphthalinesulfonic acid (DNNSA) dispersion, and organic light emitting diodes made therewith.

PAni/DNNSA polymer will be made as follows. 46.20 g DNNSA will be massed into a 500 mL Nalgene® plastic bottle. 46.2 g 2-butoxyethanol will be added to the DNNSA containing bottle. The mixture once tuned into a solution will be transferred to a jacketed 500 mL three-necked flask. 200 mL deionized will be added to the solution first before addition of 5.5 mL distilled aniline. The mixture will be cooled to about 5° C. 17 g ammonium persulfate pre-dissolved in 40 mL deionized water will be added slowly to the reaction mixture while it is being stirred rigorously. The reaction will allow proceeding for many hours. The reaction mixture will be left unstirred for phase separation of the PAni/DNNSA solid, followed by filtration.

The PAni/DNNSA solid will be re-dispersed in DMAc, N-methyl-2-pyrrolidinone (NMP), or ethylene glycol (EG) before addition of an uncoalesced, dried Nafion®polymer, to form a non-aqueous dispersion of PAni/DN NSA/Nafion®.

Alternatively, the PAni/DNNSA solid will be added to a dispersion of an uncoalesced, dried Nafion® polymer pre-dispersed in DMAc, NMP, or EG, to form a non-aqueous dispersion of PAni/DNNSA/Nafion®.

The non-aqueous dispersion of PAni/DNNSA/Nafion® will be spin-coated onto an ITO substrate, and sequentially spin-coated with either light emitting Super Yellow from Covion (Frankfurt, Germany) or Lumination Green from Dow Chemical Company (Midland, Mich., USA). A cathode of Ba/Al will then be vapor deposited on the light-emitting layer. The devices will be tested for device voltage, efficiency, and lifetime for comparison with the device made with a PAni/DNNSA dispersion without Nafion®.

A second sample of the non-aqueous dispersion of PAni/DNNSA/Nafion® will also be treated with ion exchange resins or added with sodium hydroxide to adjust the pH to a higher value for device fabrication and testing.

Example 6

This example will illustrate blending of Nafion® polymer with a non-aqueous polypyrrole (PPy)/PSSA dispersion, and organic light emitting diodes made therewith.

An aqueous PPy/PSSA dispersion will be made as follows. Into a reaction vessel, 23.30 g PSSA (30% in water) and 250 g deionized will be added. The mixture will allow stirring for half an hour. A small catalytic amount of ferric sulfate pre-dissolved in water will be added to the PPy/PSSA water solution. 2.2 g sodium persulfate dissolved in 15 g deionized water will be added to the reaction slowly. The reaction will proceed for many hours. The solid PPy/PSSA will be isolated from the dispersion either by spray-drying, freeze-drying, or centrifugation.

The solid PPy/PSSA will be pre-dispersed in DMAC, NMP, or EG. To this will be added an uncoalesced, dried Nafion® polymer, to form a non-aqueous dispersion of PPy/PSSA/Nafion®.

Alternatively, the isolated solid PPy/PSSA polymer will be added to a dispersion of un-coalesced, dried Nafion®.polymer in DMAc, NMP, or EG, to form a non-aqueous dispersion of PPy/PSSA/Nafion®.

The non-aqueous dispersion of PPy/PSSA/Nafion® will be spin-coated onto an ITO substrate, and sequentially spin-coated with either light emitting Super Yellow from Covion (Frankfurt, Germany) or Lumination Green from Dow Chemical Company (Midland, Mich., USA). A cathode of Ba/Al will then be vapor deposited on the light-emitting layer. The devices will be tested for device voltage, efficiency, and lifetime for comparison with the device made with PPy/PSSA dispersion without Nafion®.

A second sample of the non-aqueous dispersion of PPy/PSSA/Nafion® will also be treated with ion exchange resins, titrated with an aqueous basic solution or added with alkaline hydroxide solid to adjust the pH to a higher value for device fabrication and testing.

Example 7

This example will illustrate the dispersibility of Aldrich PPy in organic liquids.

A commercial aqueous polypyrrole composition (5%, w/w) from Aldrich (2003-2004 Cat # 48,255-2) is a conductive polypyrrole doped with a proprietary organic acid. The dispersion has a pH of 1.5 and conductivity of $2.1 \times 10^{-3}$ S/cm. About 10 mL of the dispersion will be placed in each of two centrifuge tubes and centrifuged with a Physician Compact Centrifuge from Caly Adams Company (Parsippany, N.J., USA). A small amount of solids will be collected by decanting the liquid on the top. While the solids are still wet, they will be dispersed in n-propanol, DMAc, and NMP. The redispersibility will allow preparation of non-aqueous electrically conductive PPy dispersions and the addition of an uncoalesced, dried Naflon® polymer.

Alternatively, the isolated solid PPy polymer will be added to a dispersion of un-coalesced, dried Nafion®polymer in DMAc, NMP, or n-propanol to form a non-aqueous dispersion of PPy/Nafion®.

The non-aqueous dispersion of PPy//Nafion® will be spin-coated onto an ITO substrate, and sequentially spin-coated with either light emitting SuperYellow from Covion (Frankfurt, Germany) or Lumination Green from Dow Chemical Company (Midland, Mich., USA). A cathode of Ba/Al will then be vapor deposited on the light-emitting layer. The devices will be tested for device voltage, efficiency, and lifetime for comparison with the device made with the PPy dispersion without Nafion®.

A second sample of the non-aqueous dispersion of PPy/Nafion® will also be treated with ion exchange resins, titrated with an aqueous basic solution or added with alkaline hydroxide solid to adjust the pH to a higher value for device fabrication and testing.

What is claimed is:

1. A composition comprising a non-aqueous dispersion having less than 40% by weight water, said dispersion comprising at least one conductive polymer doped with at least one anion selected from the group consisting of organic anions and organic acid anions, and at least one colloid-forming polymeric acid, wherein the conductive polymer is selected from a polythiophene, a polypyrrole, a polyaniline, and combinations thereof, and wherein said colloid-forming polymer acid comprises a fluorinated polymeric sulfonic acid.

2. A composition according to claim 1, wherein the organic acid anion is selected from the group consisting of non-polymeric organic acids and polymeric organic acids.

3. A composition according to claim 2, wherein the organic acid anion is derived from an organic acid selected from a non-polymeric organic acid, a water-soluble polymeric organic acid, and combinations thereof.

4. A composition according to claim 1, wherein the pH of the dispersion is between 1 and 8.

5. A composition according to claim 1, wherein the polythiophene comprises Formula I:

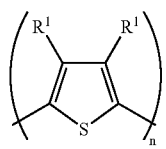

wherein:
$R^1$ is independently selected so as to be the same or different at each occurrence and is selected from hydrogen, alkyl, alkenyl, alkoxy, alkanoyl, alkythio, aryloxy, alkylthioalkyl, alkylaryl, arylalkyl, amino, alkylamino, dialkylamino, aryl, alkylsulfinyl, alkoxyalkyl, alkylsulfonyl, arylthio, arylsulfinyl, alkoxycarbonyl, arylsulfonyl, acrylic acid, phosphoric acid, phosphonic acid, halogen, nitro, cyano, hydroxyl, epoxy, aliens, siloxane, alcohol, benzyl, carboxylate, ether, ether carboxylate, ether sulfonate, and urethane; or both $R^1$ groups together may form an alkylene or alkenylene chain completing a 3, 4, 5, 6, or 7-membered aromatic or alicyclic ring, which ring may optionally include one or more divalent nitrogen, sulfur or oxygen atoms, and n is at least about 4.

6. A composition according to claim 1, wherein the polypyrrole comprises Formula II:

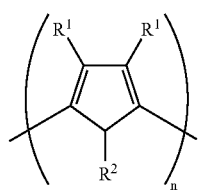

wherein:
n is at least about 4;
$R^1$ is independently selected so as to be the same or different at each occurrence and is selected from hydrogen, alkyl, alkenyl, alkoxy, alkanoyl, alkythio, aryloxy, alkylthioalkyl, alkylaryl, arylalkyl, amino, alkylamino, dialkylamino, aryl, alkylsulfinyl, alkoxyalkyl, alkylsulfonyl, arylthio, arylsulfinyl, alkoxycarbonyl, arylsulfonyl, acrylic acid, phosphoric acid, phosphonic acid, halogen, nitro, cyano, hydroxyl, epoxy, silane, siloxane, alcohol, benzyl, carboxylate, ether, ether carboxylate, ether sulfonate, and urethane; or both $R^1$ groups together may form an alkylene or alkenylene chain completing a 3,4, 5, 6, or 7-membered aromatic or alicyclic ring, which ring may optionally include one or more divalent nitrogen, sulfur or oxygen atoms; and $R^2$ is independently selected so as to be the same or different at each occurrence and is selected from hydrogen, alkyl, alkenyl, aryl, alkanoyl, alkylthioalkyl, alkylaryl, arylalkyl, amino, epoxy, silane, siloxane, alcohol, benzyl, carboxylate, ether, ether carboxylate, ether sulfonate, and urethane.

7. A composition according to claim 1, wherein the polyaniline comprises Formula III or Formula IV:

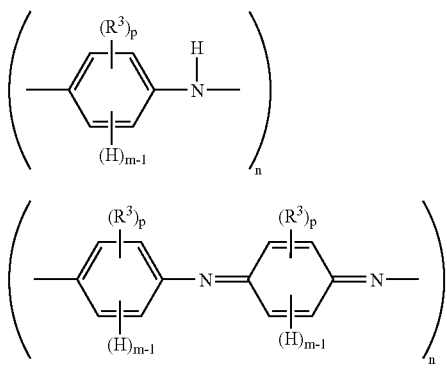

wherein:

n is at least about 4;

p is an integer from 0 to 4;

m is an integer from 1 to 5, with the proviso that p + m = 5; and $R^3$ is independently selected so as to be the same or different at each occurrence and is selected from alkyl, alkenyl, alkoxy, cycloalkyl, cycloalkenyl, alkanoyl, alkythio, aryloxy, alkylthioalkyl, alkylaryl, arylalkyl, amino, alkylamino, dialkylamino, aryl, alkylsulfinyl, alkoxyalkyl, alkylsulfonyl, arylthio, arylsulfinyl, alkoxycarbonyl, arylsulfonyl, carboxylic acid, halogen, cyano, or alkyl substituted with one or more of sulfonic acid, carboxylic acid, halo, nitro, cyano or epoxy moieties; or any two $R^3$ groups together may form an alkylene or alkenylene chain completing a 3, 4, 5, 6, or 7-membered aromatic or alicyclic ring, which ring may optionally include one or more divalent nitrogen, sulfur or oxygen atoms.

8. A composition according to claim 1, wherein the non-aqueous dispersion comprises an organic liquid selected from ethers, cyclic ethers, alcohols, polyols, alcohol ethers, ketones, nitriles, sulfides, sulfoxides, amides, amines, carboxylic acids, end mixtures thereof.

9. A composition according to claim 1, further comprising an additional material selected at least one from polymers, dyes, carbon nanotubes, metal nanowires, metal nanoparticles, carbon nanoparticles, carbon fibers, carbon particles, graphite fibers, graphite particles, coating aids, organic and inorganic conductive inks and pastes, charge transport materials, semiconductive or insulating inorganic oxide nano-particles, piezoelectric, pyroelectric, or ferroelectric oxide nanoparticles or polymers, photoconductive oxide nanoparticles or polymers, dispersing agents, crosslinking agents, and combinations thereof.

10. An electrically conductive or semiconductive layer deposited from a composition according to claim 1.

11. A buffer layer deposited from a composition according to claim 1.

12. An electronic device or other application comprising at least one layer comprising at least one composition according to claim 1.

13. A device according to claim 12, wherein the device or application is selected from devices that convert electrical energy into radiation, devices that detect signals through electronics processes, that convert radiation into electrical energy. devices having at least one electronic component, memory storage devices, energy storage devices, antistatic films, biosensor devices, electrochromic devices, and electromagnetic shielding applications.

14. A method for making a non-aqueous dispersion of a conductive polymer comprising a step selected from one of the following:

(a) dispersing conductive polymer solids doped with at least one anion selected from the group consisting of organic anions and organic acid anions, in a non-aqueous dispersion of colloid-forming polymeric acid;

(b) dispersing colloid-forming polymeric acid solids in a non-aqueous dispersion of conductive polymer doped with at least one anion selected from the group consisting of organic anions and organic acid anions; and (c) combining a non-aqueous dispersion of conductive polymer doped with at least one anion selected from the group consisting of organic anions and organic acid anions, with a non-aqueous dispersion of colloid-forming polymeric acid;

wherein said non-aqueous dispersion of a doped conductive polymer comprises less than 40% by weight water, and wherein said colloid-forming polymer acid comprises a fluorinated polymeric sulfonic acid.

15. A method according to claim 14, wherein a colloid forming polymeric acid is added to a non-aqueous dispersion of conductive polymer doped with at least one anion selected from the group consisting of organic anions and organic acid anions.

16. A method according to claim 14, wherein conductive polymer solids doped with at least one anion selected from the group consisting of organic anions and organic acid anions are added to a non-aqueous dispersion of a colloid forming polymeric acid.

17. A method according to claim 14, 15, or 16, wherein the conductive polymer and colloid-forming polymeric acid are further blended using a technique selected from sonication and microfluidization.

18. A method for making a non-aqueous dispersion of a conductive polymer comprising less than 40% by weight water, the method comprising:

combining a non-aqueous dispersion of doped conductive polymer with a non-aqueous dispersion of colloid-forming polymeric acid, wherein said colloid-forming polymer acid comprises a fluorinated polymeric sulfonic acid.

19. A composition according to claim 1, wherein said fluorinated polymeric sulfonic acid is a highly-fluorinated sulfonic acid polymer.

20. A composition according to claim 19, wherein said polymeric sulfonic acid is perfluorinated.

21. A composition according to claim 20, wherein said non-aqueous dispersion comprises an organic liquid selected from dimethylacetamide, N-methylpyrrolidone, dimethylformamide, ethylene glycol, aliphatic alcohols, and mixtures thereof.

* * * * *